United States Patent
Bartholet

(10) Patent No.: US 6,417,710 B1
(45) Date of Patent: Jul. 9, 2002

(54) SINGLE EVENT UPSET HARDENED LATCH CIRCUIT

(75) Inventor: William Bartholet, Issaquah, WA (US)

(73) Assignee: The Boeing Company, Seattle, WA (US)

(*) Notice: Subject to any disclaimer, the term of this patent is extended or adjusted under 35 U.S.C. 154(b) by 27 days.

(21) Appl. No.: 09/698,823

(22) Filed: Oct. 26, 2000

(51) Int. Cl.7 ............................................... H03K 3/286
(52) U.S. Cl. .......................... 327/200; 326/11; 326/12; 365/154
(58) Field of Search .................................. 327/199, 200, 327/208, 209, 210; 365/154, 156, 189.05; 326/10, 11, 12

(56) References Cited

U.S. PATENT DOCUMENTS

| | | | |
|---|---|---|---|
| 4,683,570 A | | 7/1987 | Bedard et al. ................ 371/36 |
| 4,785,200 A | * | 11/1988 | Huntington ................. 327/202 |
| 5,031,180 A | | 7/1991 | McIver et al. ................ 371/36 |
| 5,870,332 A | * | 2/1999 | Lahey et al. ................ 365/156 |
| 7,127,864 | * | 10/2000 | Mavis et al. ................ 327/144 |

* cited by examiner

Primary Examiner—Tuan T. Lam
(74) Attorney, Agent, or Firm—Conrad O. Gardner

(57) ABSTRACT

A single event upset (SEU) hardened latch circuit utilizing two cross-coupled inverters in which the voter output circuitry is fed back to the output node of the latch circuit.

4 Claims, 1 Drawing Sheet

UN-UPSETTABLE LATCH

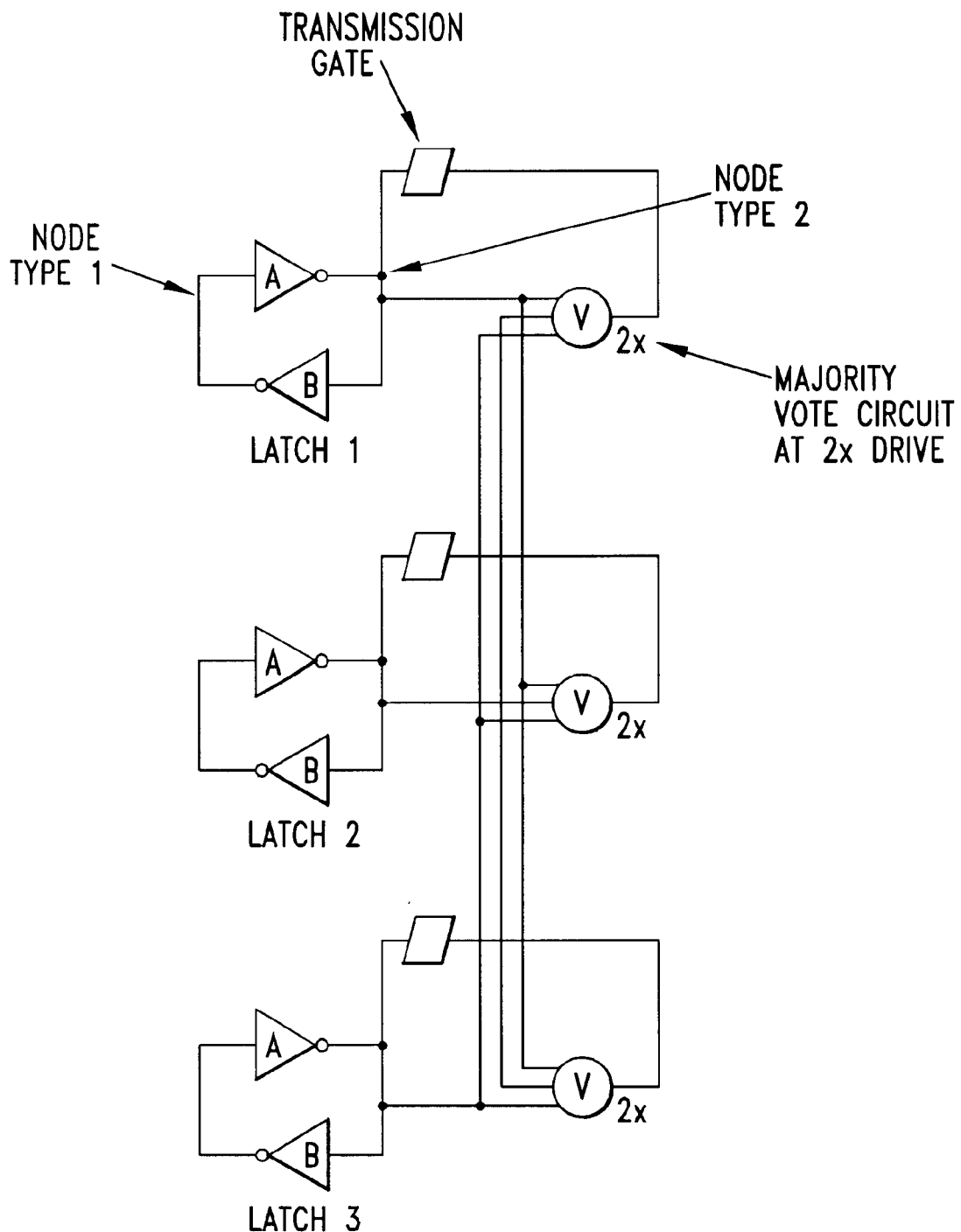
UN-UPSETTABLE LATCH

SINGLE EVENT UPSET HARDENED LATCH CIRCUIT

BACKGROUND OF THE INVENTION

This invention relates generally to single event upset (SEU) hardening of latch circuits, and, more particularly to single event upset (SEU) circuits comprised of two cross-coupled inverters.

Circuit designs which provide improved tolerance to SEU are known, see U.S. Pat. No. 4,683,570 to Bedard et al. titled "Self Checking Digital Fault Detector for Modular Redundant Real Time Clock", issued Jul. 28, 1987; and U.S. Pat. No. 5,031,180 titled "Triple Redundant Fault-Tolerant Register" to McIver et al., issued Jul. 9, 1991. The aforementioned two U.S. patents teach the use of triple redundancy with the outputs connected to three voting circuits which provide feedback to the logic circuit. In Bedard et al., voter circuitry provides an output which is used for failure detection and power-up reset. Bedard et al. being intended for a real time clock. McIver et al. provides SEU hardening for a register by employing triple redundant master slave clocked mux circuitry, each voter circuitry output providing feedback to the output of its slave mux.

BRIEF SUMMARY OF THE INVENTION

In contrast to the preceding prior art, in the present invention the voter output circuitry is fed back to the output mode of the latch circuit instead of the input to the latch. The present single event upset hardened latch circuit, in further contrast includes a voter output circuit which provides increased drive of the output latch circuit. The present latch circuit comprises a novel design hardening approach which is focused at mitigating the effect of SEU at the transistor level rather than the IC output level. This unique design for CMOS or NMOS memory or latch circuits comprises two cross-coupled inverters.

BRIEF DESCRIPTION OF THE DRAWING

FIG. 1 shows the circuit architecture of an un-upsetable latch in accordance with the present invention.

DETAILED DESCRIPTION OF THE INVENTION

Shown in the drawing for purposes of illustration, and hereinafter described, is shown a circuit for a single event upset (SEU) immune latch. Immunity to SEU is provided for any cosmic ray particle in any soft commercial CMOS process.

The present latch is made immune by triple redundancy, in which each of the redundant latch outputs are input to each of three majority vote circuits. The increased drive output of each one of the majority vote circuit is feedback to each one of the latch inputs. The present design provides immunity to SEU for any cosmic ray particle, and is applicable in any commercial semiconductor process. In order to write to the latch, two conditions must be met: 1) all three latches must be rewritten at the same time; and 2) the increased vote circuit drive must be overcome. This is accomplished with a feedback transmission gate, which can be turned off.

Control applications of computers require SEU immune registers. Historically this has been accomplished by voting. But for voting to work, the SEU rate must be low enough that majority upset is a low probability condition. Current voting schemes cumulate SEU effects over significant time periods. As the feature sizes of computers decreases, the SEU susceptibility increases rapidly, and in the near term is likely to make cumulative susceptible voting schemes non-workable. The present invention described in detail in the following provides voting feedback that resets errors in real time.

The present circuit architecture utilizing a single event upset (SEU) soft latch is described that is immune to SEU of its stored memory value. FIG. 1 shows how triplicating an SEU soft latch, triplicating a majority vote circuit, and feeding back the voted output with increased drive strength (2× drive chosen as an example) to the individual latches results in a total latch function immune to SEU upset. Immunity is for any arbitrarily large charge collection event; i.e., the circuit is un-upsetable to any cosmic ray particle in any soft commercial semiconductor process.

Principle of Operation

In this highly symmetrical circuit, there are only two distinct types of nodes (replicated three times) when in data retention mode. For convenience, these are identified around Latch 1 in the figure. Two different circuit dynamics result depending on whether an SEU event upsets node 1 or node 2. These two events are described below, followed by how to write new data into this latch:

Node 1 Upset:

An SEU strike occurs in the circuitry of Latch 1 in the off transistor of inverter B. The initial charge from the SEU event initially overwhelms Node 1 to upset. If of sufficient charge, this causes inverter A to switch state and attempt to drive node 2 also to the wrong value. Node 2, however, is also being driven (still correctly) by the 2× drive strength output of the three-latch vote circuit. These two competing drives will act as a resistive voltage divider limiting the voltage swing of the node. Inverter A cannot change the voltage of node 2 to cross the logic switching voltage (Vdd/2) against the 2× drive vote circuit. This means node 2 never changes logic value and does not upset. Inverter B, driven by node 2, never changes its driving output to restore the correct value to node 1. Its ON transistor's drive current will eventually flush away the initial SEU charge and the circuit returns to its original undisturbed state.

Node 2 Upset:

An SEU strike occurs in the circuitry of Latch 1 either in the off transistor of the inverter A, or in an off transistor of the vote circuit. The initial charge from the SEU event initially overwhelms node 2 to upset (despite the 2× vote circuit drive), and causes a one-out-of-three error into all three vote circuits. This SEU overwhelming of the vote circuit output is why it too must b e triplicated and fed back to only one latch each, ensuring that only a one-out-of-three error results. The vote circuit drive, then, remains correct by two out of three vote of all three latches. If the SEU event on node 2 is of sufficient charge, this causes inverter B to switch state and to drive node 1 also to the wrong value. This causes Latch 1 to upset, however, node 2 is also being driven (still correctly) by the 2×-drive strength output of the three-latch vote circuit. The vote circuit's correct drive will remove the SEU charge and in competition against the 1× drive strength of the upset inverter A, will pull node 2 to cross the switching voltage back to its correct logic value. This will switch inverter B back to its right value and restore node 1, which restores inverter A. The fully restored Latch 1 now outputs its correct value into the vote circuit, and the circuit is fully restored.

As for the node 1 upset above, the restoration of the original correct state is independent of the strength of the SEU event or the size of the transistors in the circuit. Only the time duration of the above circuit dynamics for restoration of the upset will depend on the amount of initial SEU charge collected by the circuit and the drive strength of the circuit's transistors. The output of this triplicated latch (assumed to be one of the three node 2's) is disturbed in a transient fashion until the vote circuit strength restores node 2 for this node 2 upset.

Writing the Latch:

The inability of an SEU event to change the latch's stored value is due to the never disturbed, overwhelming increased drive strength of the vote circuit. In order to successfully change the stored value of the triplicated latch, two conditions must be met: 1) all three latches must be rewritten at the same time to change the vote; and 2) the increased vote circuit drive must be overcome.

The first condition is easily met, but there are multiple approaches to the second condition. Either the vote circuit drive is switched off during a write cycle, or additional drive strength for inverter A, driving node 2 is powered on only during the write cycle. The first approach can be implemented with the addition of a transmission gate on the vote circuit's feedback path to node 2 (parallel to inverter A and of enough combined strength to overcome the vote circuit) whose Vdd supply is connected to the write enable signal for the latch. Each of these added circuit elements are still triplicated and cannot add any new SEU events that overcome the basic voting of the circuit.

Wider Applications of the Present Latch Circuit:

The latch example shown here is one application of the present circuit. The last memory retaining stage of a 6-nand gate flip-flop is an RS latch. It can be wired up as shown in FIG. 1 and result in an SEU hardened flip-flop which are commonly used as data registers.

Conclusions:

As feature sizes of modern electronics continues to shrink, the SEU problem will increase dramatically. The present SEU solution is unique in being hard to any particle for any transistor feature size and will provide a lasting solution approach for future shrinking electronics. Although the present SEU solution is area intensive, transistor sizes are presently so small that the area penalty is diminishing as a sensitive concern when millions of transistors per chip are now available.

The preceding and further advantages will appear to those skilled in the art upon a reading of the foregoing specification.

While the preferred embodiments of the invention have been illustrated and described, variations will be apparent to those skilled in the art. Accordingly, the invention is not to be limited to the specific embodiments illustrated and described, and the true scope of the invention is to be determined by reference to the following claims.

What is claimed is:

1. A triple redundant latch circuit having redundant latch outputs coupled to the inputs respectively of three majority vote circuits, the increased drive output of each of said three majority vote circuits providing feedback to each of the latch inputs of said triple redundant latch circuit.

2. The triple redundant latch circuit of claim 1, further comprising writing of said triple redundant latch circuit at the same time; and, overcoming the increased vote circuit drive by providing a feedback transmission gate capable of being turned off.

3. The method of providing a total latch function immune to SEU upset comprising the steps of:

triplicating an SEU soft latch;

triplicating a majority vote circuit; and, feeding back the voted output with increased drive strength to individual latches.

4. A single event upset (SEU) hardened latch circuit comprising in combination:

a plurality of latch circuits;

a corresponding plurality of majority vote circuits at increased drive coupled to respective ones of said plurality of latch circuits; and, a feedback transmission gate coupled between said corresponding plurality of majority vote circuits at increased drive and said plurality of latch circuits.

\* \* \* \* \*